Figure 1:
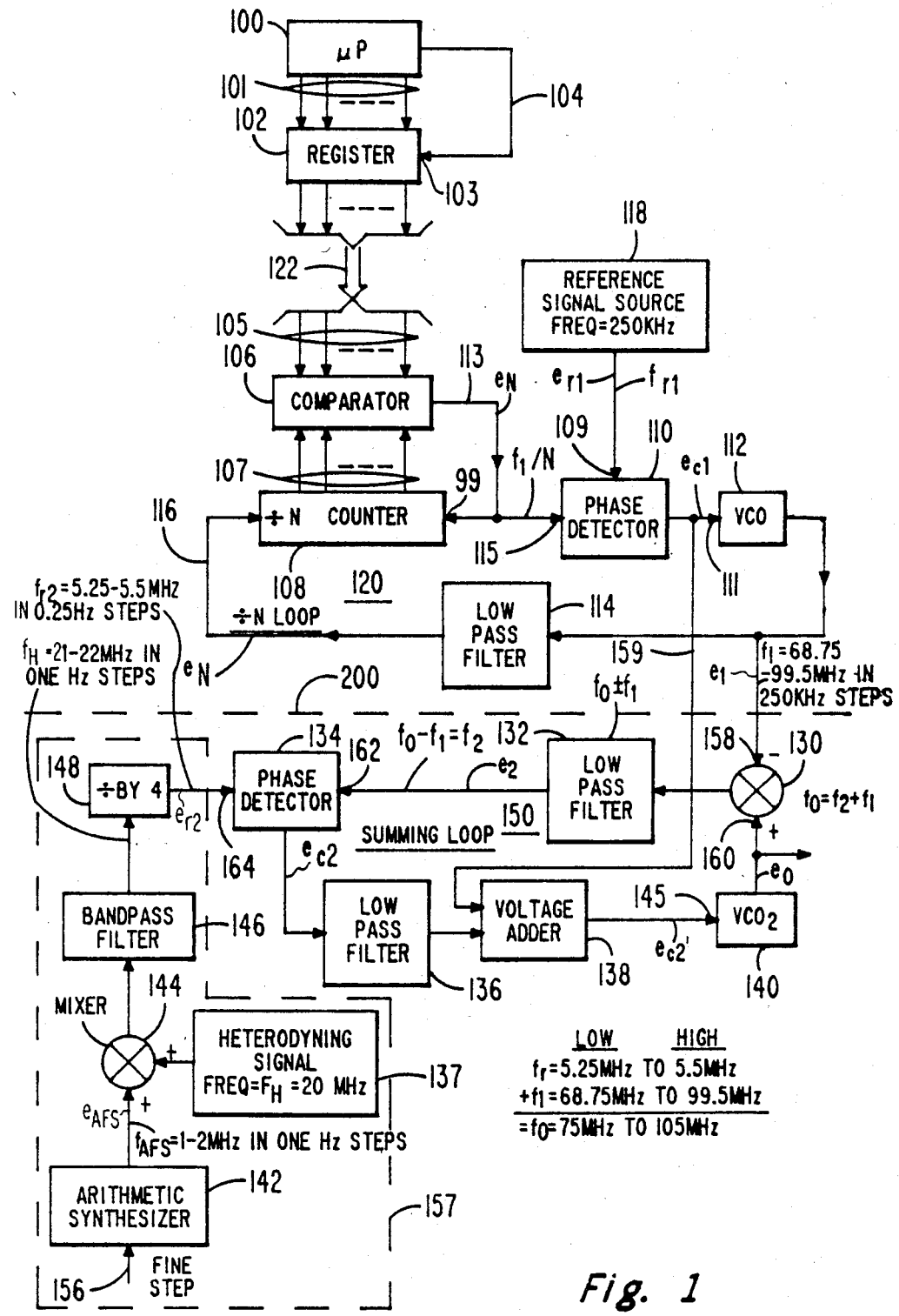

United States Patent [19]

Crowley

[11] Patent Number: 4,516,084
[45] Date of Patent: May 7, 1985

[54] FREQUENCY SYNTHESIZER USING AN ARITHMETIC FREQUENCY SYNTHESIZER AND PLURAL PHASE LOCKED LOOPS

[75] Inventor: Albert T. Crowley, Somerdale, N.J.

[73] Assignee: RCA Corporation, Princeton, N.J.

[21] Appl. No.: 467,644

[22] Filed: Feb. 18, 1983

[51] Int. Cl.³ .............................................. H03L 7/00
[52] U.S. Cl. ........................................ 331/2; 331/12; 331/16; 331/25
[58] Field of Search ................... 331/2, 10, 11, 12, 16, 331/22, 25

[56] References Cited

U.S. PATENT DOCUMENTS

| | | | |
|---|---|---|---|
| 4,039,806 | 8/1977 | Fredriksson et al. | 328/14 X |
| 4,114,110 | 9/1978 | Nossen | 331/2 |
| 4,192,007 | 3/1980 | Becker | 364/721 |
| 4,283,768 | 8/1981 | Scott | 364/607 |
| 4,301,415 | 11/1981 | McFayden | 328/24 |
| 4,388,597 | 6/1983 | Bickley et al. | 331/2 |

OTHER PUBLICATIONS

"Frequency Synthesis by Phase Lock", William F. Egan, 1981, Wiley of New York, pp. 75-77.

Primary Examiner—Eugene R. LaRoche
Assistant Examiner—Robert J. Pascal
Attorney, Agent, or Firm—Joseph S. Tripoli; Robert L. Troike; Christopher Lyle Maginniss

[57] ABSTRACT

A frequency synthesizer for controlling the frequency $f_0$ of a signal $e_0$ in response to a control signal $e_{c2}$ to produce a band of selectable frequencies separated by $\Delta f$ between the frequencies $f_x$ and $f_y$, where $(f_x + R\Delta f) = f_0$ and R is zero or any integer $\leq (f_y - f_x)/\Delta f$. The invention includes a first generator for generating the signal $e_0$, a second generator for generating a signal $e_1$ having a band of selectable frequencies separated by $\delta f$, where $\delta f > > \Delta f$, a frequency subtractor for subtracting $f_1$ from $f_0$ to produce a signal $e_2$ of frequency $f_2$. Also provided is a third generator for generating a variable preliminary reference signal of frequency $f_{pr}$ consisting of a band of selectable frequencies separated by $M\Delta f$ and lying within the frequency band $Mf_x$ to $Mf_y$, where $(Mf_x + R \cdot M\Delta f) = Mf_{r2}$; a divider for dividing $Mf_{r2}$ by M to produce a band of signal frequencies $(f_x + R\Delta f) = f_{r2}$; and a comparator for comparing $f_2$ with $f_{r2}$ to produce the control signal $e_{c2}$.

9 Claims, 2 Drawing Figures

FREQUENCY SYNTHESIZER USING AN ARITHMETIC FREQUENCY SYNTHESIZER AND PLURAL PHASE LOCKED LOOPS

The United States Government has rights in this invention pursuant to Government Contract No. DAAK20-81-C-0376 awarded by the Department of the Army.

This invention relates generally to frequency synthesizers and more particularly to an improved frequency synthesizer utilizing an arithmetic frequency synthesizer (AFS) and to the method of obtaining such improved frequency synthesis.

In the prior art there are various logic arrangements for generating a large number of very closely spaced frequencies of the order of 0.25 Hz in a frequency bandwidth extending, in the example which will be used herein, from 75 MHz–105 MHz. However, such schemes involve a great deal of hardware and are quite costly. One of these schemes is disclosed in a publication entitled "A High-Priority, Fast-Switching Synthesized Signal Generator" appearing in the February, 1981, issue of the Hewlett-Packard Journal, and incorporated herein by reference.

Another prior art scheme for generating such fine frequency increments includes a first divide-by-N phase locked loop for controlling the frequency $f_{VCO1}$ of the output $e_{VCO1}$ of a first voltage controlled oscillator ($VCO_1$). The output frequency $f_{VCO1}$ is altered by changing the value of N in the divide-by-N counter in a well known manner.

The output of $VCO_1$ is supplied to a frequency subtractor which also receives the output signal of a second voltage controlled oscillator ($VCO_2$) which is part of a second phase locked loop, defined herein as a summing loop, and whose range of frequencies $f_{VCO2}$ differs from $f_{VCO1}$ by a range of frequencies extending from 5.25 MHz to 5.5 MHz, in the example being used herein. The frequency subtractor subtracts $f_{VCO1}$ from $f_{VCO2}$ and supplies the difference frequencies through a filter to one input of a phase detector, the other input of which receives a reference signal which also varies between 5.25 and 5.5 MHz in small frequency steps such as 0.25 Hz, and which, in fact, determines the specific difference frequency between $f_{VCO1}$ and $f_{VCO2}$. To complete the summing loop the output of the phase detector is supplied back to the frequency control input of $VCO_2$ so that its output frequency is in turn variable in 0.25 Hz steps. Thus, the gross frequency change is produced by changing the value of N in the divide-by-N counter of the first phase locked loop and which can be, for example, in steps of 250 KHz whereas the fine frequency adjustments are produced by the summing loop and more specifically by the small 0.25 Hz steps created in the reference signal supplied to the phase detector of the summing loop.

The variable reference signal, which is steppable in 0.25 Hz steps, can be generated in the prior art by extensive hardware at substantial cost. Such a reference signal can also be generated by an arithmetic frequency synthesizer (AFS) which is capable of generating a spectrum of frequencies over a 1 MHz band in steps of 1 Hz or less. Many schemes exist in the prior art utilizing AFS's for creating a band of selectable and closely spaced frequencies. However, these prior art architectures for synthesizing frequencies are unable to provide a spectrum of closely spaced frequencies, in the radio frequency band, with spurious signals lying below −60 dB.

The present invention provides an improved structure and method for synthesizing frequencies utilizing an AFS that provides spurious signal levels of the order of −75 to −80 dB down, an improvement of approximately 15 to 20 dB in signal-to-noise (S/N) ratio.

Before setting forth a statement of the invention it is believed appropriate to generally describe an AFS which is an important part of the invention. An AFS consists essentially of a digital accumulator to indicate the phase of a desired output waveform such as a sine wave. A frequency control word $f_n$, having a digital value which represents a discrete step in phase, is repeatedly entered into the accumulator and repeatedly added to the contents of the accumulator at a given clock rate $f_c$. The total capacity of the accumulator represents 360° or one full cycle of the output signal of the AFS. At any given time, the contents of the accumulator, which represent the instantaneous phase of the sine wave, is supplied in parallel, as addresses, to a sine look up table which can be a read-only-memory (ROM) whose contents, in turn, contain digital amplitude values corresponding to the phase indicating addresses. Such digital amplitude values are supplied to a digital-to-analog converter (DAC) which converts the digital signals to analog signals.

The output frequency of the AFS is given by the following expression:

$$f_0 = f_n/n_c \times f_c$$

where: $f_c$=the accumulator clock frequency, $n_c$=total accumulator capacity, and $f_n$=phase step (frequency control number).

Typical values for $f_c$ and $n_c$ are 10 MHz and $10^7$, respectively, which will provide a frequency resolution of 1 Hz.

In accordance with a preferred embodiment of the invention, there is provided a frequency control circuit for controllably varying the frequency $f_0$ of a signal $e_0$, in response to a control signal $e_c$ to produce a band of selectable output frequencies ($f_x$ to $f_y$) separated by $\Delta f$, where $(f_x + n\Delta f) = f_0$ and n is 0 or $n \leq (f_y - f_x)/\Delta f$. Also provided is a first signal source for generating $e_0$, a second signal source for generating a signal $e_1$ having a band of selectable frequencies separated by $\delta f$, where $\delta f >> \Delta f$, and frequency subtracting logic for subtracting $f_1$ from $f_0$ to produce a signal $e_2$ of frequency $f_2 = f_0 - f_1$. A third signal generating source generates a reference signal $e_r$ having a band of selectable frequencies ($Mf_x$ to $Mf_y$) separated by $M\Delta f$, and a frequency divider for dividing the frequency band ($Mf_x$ to $Mf_y$) by M to produce a band of frequencies ($f_x$ to $f_y$) = ($f_x + R\Delta f$) = $f_r$, where R is an integer $\leq (f_y - f_x)/\Delta f$, and a comparator for comparing $f_r$ and $f_2$ to produce the control signal $e_c$.

Figure 2:
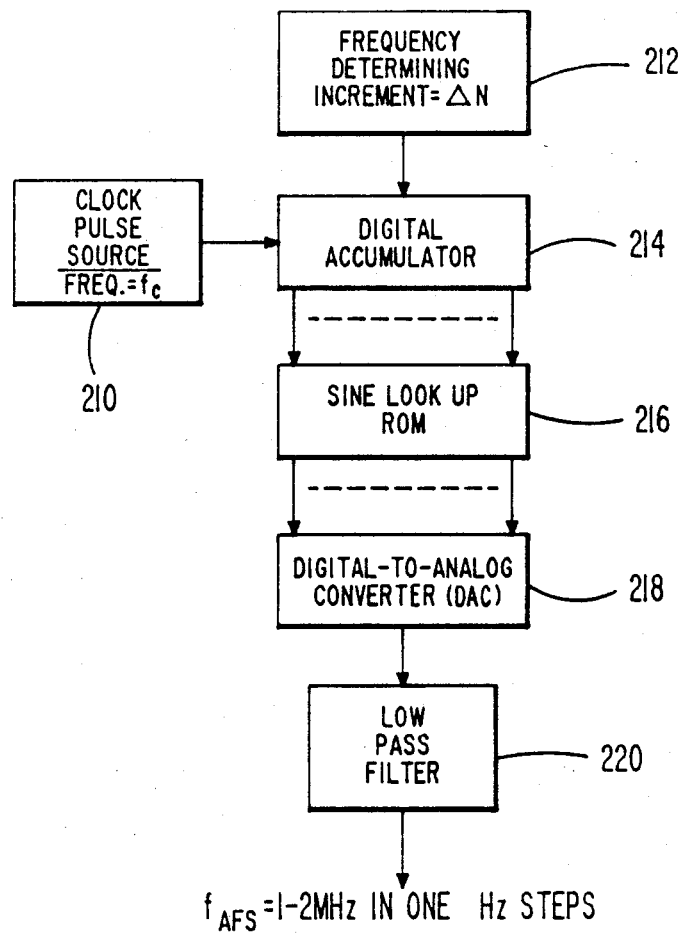

In the drawings:

FIG. 1 is a block diagram of the invention; and
FIG. 2 is a block diagram of an arithmetic frequency synthesizer.

In FIG. 1 the logic above the dashed line 200 shows a standard divide-by-N phase locked loop circuit comprising a voltage controlled oscillator (VCO) 112 whose output is supplied through low pass filter 114 to the input of divide-by-N counter 108 which divides the frequency $f_1$ of the output of VCO 112. The output $e_N$ of the divide-by-N counter 108 (which is actually the output of comparator 106 via lead 113 as will be seen later) is supplied to a first input 115 of phase detector 110. A reference signal source 118 supplies a signal $e_{r1}$ of frequency $f_{r1}$ to the second input 109 of phase detector 110 which responds thereto and to the output $e_N$ of divide-by-N counter 108 to supply a control signal $e_{c1}$ to VCO 112 which responds thereto to assume a new output frequency $f_1$ which, when divided by N will equal the reference frequency $f_{r1}$ when phase lock is established.

The output frequency $f_1$ of VCO 112 can be changed by changing the value of N in counter 108, with each incremental change of one in the value of N causing $f_1$ to change by $f_{r1}$ which, in the example being discussed, is 250 KHz. The value of N is changed by logic including a suitable control means which directs the change such as microprocessor 100, a register 102, and a comparator 106. When a change in the value of N is desired the microprocessor 100 supplies the new value of N to the input terminals 101 of register 102, with N subsequently being entered into register 102 in response to an enable pulse supplied to the enable input 103 of register 102 from microprocessor 100 via lead 104. Such N value is then presented through one set of parallel inputs 105 to comparator 106 via bus 122 with the current count value contained in counter 108 being supplied simultaneously through the other parallel set of inputs 107 to comparator 106. The comparator 106 responds to the two input signals supplied thereto to supply an output signal on its output terminal 113 when the counter 108 attains a count value of N. Such output signal from comparator 106 is supplied to the input of phase detector 110 and its rate of occurrence is, in fact, the frequency $f_1/N$. Obviously, any new value of N supplied to register 102 will result in a signal being supplied from comparator 106 on output lead 113 each time the counter 108 attains such new value of N. Such signal is also supplied to reset-to-0 input 99 of counter 108 in preparation for the next count to N thereby.

The logic below the dashed line 200 in FIG. 1 consists of the summing loop 150, which is a type of phase locked loop circuit, with a reference signal $e_{r2}$ of frequency $f_{r2}$ being generated at the output of a divide-by-4 divider 148 and a frequency subtractor 130 being interposed between the outputs of VCO 140 and VCO 112 and the input to low pass filter 132.

The remaining logic below dashed line 200 includes, within block 157, the AFS 142, a heterodyning signal generator 137, a frequency mixer 144, a bandpass filter 146, and the divide-by-4 circuit 148, all of which function together to generate the reference signal $e_{r2}$ which is supplied to input 164 of phase detector 134.

Before discussing the aforementioned logic within block 157 the basic elements of the summing loop 150 will be described in more detail. The output signal $e_0$ (of variable frequency $f_0$) of VCO 140 is supplied to one input of frequency subtracting circuit logic 130 with the output of VCO 112 being supplied to the other input 158 of subtraction logic 130. The frequency subtractor 130 subtracts the frequency output $f_1$ of VCO 112 from the frequency $f_0$ output of VCO 140 with the sum and difference of the two frequencies being supplied to the input of low pass filter 132. For reasons that will become clearer later and in accordance with the hypothetical frequency bandwidths assumed herein the output frequency $f_1$ of VCO 112 must vary between 68.75 MHz and 99.5 MHz in order that the output frequency $f_0$ of VCO 140 will have a frequency range extending from 75 MHz to 105 MHz.

Because of the coupling effect produced by frequency subtractor 130 between the phase locked loop 120 and the summing loop 150 the lower frequency limit 68.75 MHz of $f_1$ at the output of VCO 112 occurs simultaneously with the lower frequency limit 75 MHz at $f_0$ at the output of VCO 140. Similarly, the two higher frequency limits 99.5 MHz and 105 MHz occur simultaneously.

The difference between $f_0$ and $f_1$ must always be equal to $f_{r2}$ although voltage adder 138 permits VCO 140 to change frequency in large increments, for reasons to be explained later.

Between the range of 75 MHz and 105 MHz the frequency $f_0$ can be varied in very small steps of 0.25 Hz, also as will be discussed in detail later. Each change of frequency of 0.25 Hz at the output of VCO 140 will be accompanied by a change in frequency of 0.25 Hz at the output of VCO 112 for the following reasons.

Specifically, the 0.25 Hz steps occur in the following manner. Since the output frequency of divide-by-4 circuit 148 can be varied by 0.25 Hz steps it follows that the frequency supplied to the other input 162 of phase detector 134 must also vary by 0.25 Hz steps in order to maintain the system in a phase locked condition. That portion of the final control signal $e_{c2}$ supplied through low pass filter 136 to voltage adder 138 and then to the frequency control input terminal 145 of VCO 140 will accordingly change its output frequency by increments of 0.25 Hz. Such 0.25 Hz changes in frequency will appear at the output of frequency subtractor 130 and will then pass through low pass filter 132 to input 162 of phase detector 134 to cause the system to again become phase locked, but with a 0.25 Hz change in $f_0$.

The voltage adder 138 also functions to cause the output frequency $f_0$ of VCO 140 to change in quantum steps of 250 KHz each time the divide-by-N counter is changed by an increment of 1 to cause the output frequency $f_1$ of VCO 112 to change by 250 KHz. It is assumed that VCO 112 and VCO 140 has similar operating characteristics so that the dc voltage supplied to frequency control input 111 of VCO 112 and also supplied through voltage adder 138 via lead 159 to the frequency control input 145 of VCO 140 will cause a quantum change of 250 KHz in both $f_1$ and $f_0$.

The AFS, represented by block 142, is designed to generate an output frequency $f_{AFS}$ between 1 and 2 MHz in 1 Hz steps, a capability well within the scope of an AFS. Such output signal is heterodyned up to the frequency band of 21 to 22 MHz ($f_H$) by a 20 MHz signal generated by heterodyning signal source 137.

It is inherent in an AFS that spurious signals are generated in the output thereof, some of which lie quite close to the output frequency $f_{AFS}$ of the AFS and others of which are quite distant from $f_{AFS}$. In order to eliminate those spurious frequency components somewhat removed from $f_{AFS}$ the bandpass filter 146 is provided. To remove those spurious signals lying close to the heterodyned frequency bandwidth (21 to 22 MHz) at the output of bandpass filter 146 there is provided a divide-by-4 circuit 148.

The division of the 21–22 MHz bandwidth supplied from bandpass filter by divide-by-4 logic 148 results in an attenuation of the spurious signal components which lie close to the 21–22 MHz bandwidth. More specifically, it can be shown mathematically that each division by 2 of the output of bandpass filter 146 will result in a 6 dB attenuation of the spurious components of such signals. Since the division is by 4 the total attenuation of the spurious components is approximately 12 db which is a significant improvement in the S/N ratio of the signal $e_{r2}$ supplied to phase detector 134. As a result of such improved S/N ratio of the reference signal $e_{r2}$ the output of phase detector 134 will have substantially less perturbations resulting in less corresponding perturbation in the output of VCO 140. Such improvement in the S/N ratio of the system is of great significance since the selectable frequencies are separated by only 0.25 Hz.

A mathematical proof of the 12 dB improvement obtained by dividing the output frequency of bandpass filter 146 by 4 is set forth on pages 75–77 of a publication entitled, "Frequency Synthesis By Phase Lock" by William F. Egan, and published in 1981 by Wiley of New York and incorporated herein by reference.

Referring now to FIG. 2 there is shown a basic block diagram of an AFS. In FIG. 2 a digital accumulator 214 having a capacity of $10^7$ accumulates the frequency-determining-increment $\Delta N$ from source 212 in response to each clock pulse from clock pulse source 210 which, in the example being described herein, is at 10 MHz. The quantity $\Delta N$ can be any value in a range of from $10^6$ to $2\times 10^6$. Thus, when $\Delta N = 10^6$ the digital accumulator 214 will fill up at a rate equal to 1/10 of the clock pulse frequency $f_c = 10^7$ MHz. When $\Delta N = 2\times 10^6$ the accumulator 214 will fill up at a rate equal to 1/5 of the 10 MHz clock rate, or at a fill-up rate of $2\times 10^6$ times per second. By varying $\Delta N$ in increments of 1 the fill-up rate of accumulator 214 will thus be varied by 1 Hz in the frequency range between 1 MHz and 2 MHz.

The value accumulated in accumulator 214 represents the phase of the function being generated which, in the example being discussed herein, is a sine wave. Accordingly a sine look up ROM 216 is provided which responds to each new phase accumulation in accumulator 214 to output a digital word representative of the amplitude of the sine wave at that particular phase. A digital-to-analog converter (DAC) 218 converts the digital output of ROM 216 to an analog signal which is then passed through low pass filter 220 to provide an output signal $e_{AFS}$ having a frequency $f_{AFS}$ which can be varied between 1 and 2 MHz in 1 Hz steps.

I claim:

1. A frequency synthesizer comprising:
a phase locked loop comprising a first voltage controlled oscillator (VCO) for generating a signal $e_1$ of frequency $f_1$ and having a frequency control input, a divide-by-N divider to divide $f_1$ by N to produce a signal $e_N$ of frequency $f_1/N$, a first phase detector responsive to $e_N$ and to a reference signal $e_{r1}$ of frequency $f_{r1}$ to produce a control signal $e_{c1}$, and means coupling $e_{c1}$ to the frequency control input of said first VCO;
a means for changing the value of N in said divider;
a summing phase locked loop comprising a second VCO for generating a signal $e_0$ of frequency $f_0$, and having a frequency control input, a subtractor for subtracting $f_1$ from $f_0$ to produce a signal $e_2$ of frequency $f_2 = f_0 - f_1$, logic means including a second phase detector responsive to $e_2$ and a second reference signal $e_{r2}$ to produce a second frequency control signal $e_{c2}$, and filter means responsive to $e_{c2}$ for supplying a filtered $e_{c2}'$ to the frequency control input of said second VCO; and
means for generating said second reference signal $e_{r2}$ comprising:
an accumulator containing digital data corresponding to the instantaneous phase of a waveform, said data contents being augmented by a selectable increment in response to each pulse of a clocking signal applied to said accumulator, said accumulator having overflow capability when said data contents are augmented beyond the capacity of said accumulator;
means responsive to said data contents of said accumulator for providing a signal of frequency $f_{AFS}$, said signal having said waveform and having period equal to the time between successive overflow occurrences of said accumulator;
source means for providing a heterodyning signal of predetermined frequency;
means responsive to said signal of frequency $f_{AFS}$ and to said heterodyning signal for generating a heterodyned signal having frequency $f_H$ which is the sum of $f_{AFS}$ and the frequency of said heterodyning signal; and
means coupled to said heterodyned signal for dividing the frequency $f_H$ of said heterodyned signal by an integer M to produce said second reference signal $e_{r2}$ of frequency $f_{r2}$.

2. A frequency synthesizer as in claim 1 in which said logic means further comprises voltage adder means responsive to the output signals of said first phase detector and said filter means to produce $e_{c2}'$.

3. A frequency synthesizer as in claim 1 in which said means for generating said second reference signal further comprises a bandpass filter coupled between said means for generating a heterodyned signal and said dividing means.

4. A frequency synthesizer as in claim 1 in which said means for providing a signal of frequency $f_{AFS}$ includes a read-only-memory (ROM) responsive at its addressing inputs to said data contents of said accumulator, said ROM containing digital amplitude data corresponding to the instantaneous phase of said waveform.

5. A frequency synthesizer as in claim 4 in which said means for providing a signal of frequency $f_{AFS}$ further includes a digital-to-analog converter responsive at its inputs to said digital amplitude data of said ROM for providing said signal having said waveform.

6. A frequency synthesizer comprising:
a first divide-by-N phase locked loop comprising a $\div N$ counter, a first phase detector having first and second inputs, and a first voltage controlled oscillator (VCO), all connected in tandem, for generating a signal $e_1$ having frequency $f_1$, where $f_1 = Nf_{r1}$, with N being a variable integer and $f_{r1}$ being a first reference frequency supplied to said second input of said first phase detector;
a second VCO responsive to a control signal to generate an output signal $e_0$ of frequency $f_0$;
logic including subtracting means responsive to $e_1$ and $e_0$ to produce a signal $e_2$ of frequency $f_2 = f_0 - f_1$;
an accumulator containing digital data corresponding to the instantaneous phase of a waveform, said data contents being augmented by a selectable increment in response to each pulse of a clocking signal applied to said accumulator, said accumulator having overflow capability when said data contents are augmented beyond the capacity of said accumulator;
means responsive to said data contents of said accumulator for providing a signal of frequency $f_{AFS}$, said signal having said waveform and having period equal to the time between successive overflow occurrences of said accumulator;

source means for providing a heterodyning signal of predetermined frequency;

means responsive to said signal of frequency $f_{AFS}$ and to said heterodyning signal for generating a heterodyned signal having frequency $f_H$ which is the sum of $f_{AFS}$ and the frequency of said heterodyning signal;

means coupled to said heterodyned signal for dividing the frequency $f_H$ of said heterodyned signal by an integer M to produce a signal $e_{r2}$ of frequency $f_{r2}$, where $f_{r2} = f_H/M$; and a second phase detector responsive to $e_{r2}$ and $e_2$ to produce said control signal.

7. A method of synthesizing frequencies by altering the frequency $f_0$ of the output signal $e_0$ of a voltage controlled oscillator (VCO) in response to a control signal $e_{c2}$ comprising the steps of:

augmenting by a selectable increment and at a predetermined rate the data contents of a digital accumulator;

generating a signal $e_{AFS}$ having waveform corresponding to said data contents, wherein said selectable increment determines the frequency $f_{AFS}$ of said signal $e_{AFS}$, said frequency $f_{AFS}$ being selectable within a first band of frequencies separated by $M\Delta f$, where M is a positive integer;

combining signal $e_{AFS}$ with a heterodyning signal of predetermined frequency $F_H$ to produce a preliminary reference signal having frequency within a second band of frequencies which is the sum of $F_H$ and said first band of frequencies;

dividing the frequency of said preliminary reference signal by M to produce a second reference signal $e_{r2}$ having frequency within a third band of selectable frequencies separated by $\Delta f$;

generating a signal $e_1$ having a frequency $f_1$ which is variable in steps of $\delta f_1$, where $\delta f_1 >> \Delta f$;

subtracting $f_1$ from $f_0$ to produce a signal $e_2$ of frequency $f_2$; and comparing the frequency and phase of $e_{r2}$ and $e_2$ to produce the control signal $e_{c2}$.

8. A method of synthesizing frequencies by altering the frequency $f_0$ of the output of a voltage controlled oscillator (VCO) in response to a control signal $e_{c2}$ comprising the steps of:

generating a first signal $e_1$ having a frequency $f_1$ which is alterable in steps of $\delta f$;

producing a second signal $e_2$ of frequency $f_2$ where $f_2 = (f_0 - f_1)$;

augmenting by a selectable increment and at a predetermined rate the data contents of a digital accumulator;

generating a signal $e_{AFS}$ having waveform corresponding to said data contents, wherein said selectable increment determines the frequency $f_{AFS}$ of said signal $e_{AFS}$, said frequency $f_{AFS}$ being selectable within a first band of frequencies separated by $M\Delta f$, where M is an integer;

combining signal $e_{AFS}$ with a heterodyning signal of predetermined frequency $F_H$ to produce a preliminary reference signal having frequency $Mf_{r2}$ within a second band of frequencies which is the sum of $F_H$ and said first band of frequencies;

dividing the frequency of said preliminary reference signal by M to produce a second reference signal $e_{r2}$ having frequency $f_{r2}$ within a third selectable band of frequencies spaced apart by $\Delta f$; and comparing $f_2$ with $f_{r2}$ to produce $e_{c2}$.

9. A frequency synthesizer for controlling the frequency $f_0$ of a signal $e_0$ in response to a control signal $e_{c2}$ to produce a band of selectable frequencies separated by $\Delta f$ between the frequencies $f_x$ and $f_y$, where $(f_x + M\Delta f) = f_0$ and M is zero or any positive integer $\leq (f_y - f_x)/\Delta f$, said frequency synthesizer comprising:

first means for generating a signal $e_0$ having frequency $f_0$;

second means for generating a signal $e_1$ having a band of selectable frequencies $f_1$ separated by $\delta f$, where $\delta f >> \Delta f$;

means for subtracting $f_1$ from $f_0$ to produce a signal $e_2$ of frequency $f_2 = f_0 - f_1$;

a digital accumulator responsive to pulses of a clocking signal of a predetermined frequency, wherein the data contents of said digital accumulator are augmented by a selectable increment;

third means for generating a signal $e_{AFS}$ corresponding to said data contents of said digital accumulator, wherein said selectable increment determines the frequency $f_{AFS}$ of said signal $e_{AFS}$, said frequency $f_{AFS}$ being selectable within a first band of frequencies separated by $M\Delta f$;

source means for providing a heterodyning signal of predetermined frequency $F_H$;

means for combining signal $e_{AFS}$ with said heterodyning signal to produce a variable preliminary reference signal of frequency $Mf_{r2} = f_{AFS} + F_H$, wherein $Mf_{r2}$ lies within a second band of frequencies which is the sum of $F_H$ and said first band of frequencies;

means for dividing the frequency of said preliminary reference signal by M to produce a signal of frequency $f_{r2}$ within a band of frequencies $f_x$ to $f_y$; and means for comparing $f_2$ with $f_{r2}$ to produce the control signal $e_{c2}$.

* * * * *